United States Patent
Park et al.

(10) Patent No.: US 8,395,145 B2
(45) Date of Patent: Mar. 12, 2013

(54) TOP-EMITTING ORGANIC LIGHT-EMITTING DEVICE

(75) Inventors: Mie-Hwa Park, Yongin (KR);
Min-Seung Chun, Yongin (KR);
Kyung-Hoon Choi, Yongin (KR);
Young-Suck Choi, Yongin (KR);
Young-Ho Park, Yongin (KR);
Hee-Seong Jeong, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 28 days.

(21) Appl. No.: 12/959,288

(22) Filed: Dec. 2, 2010

(65) Prior Publication Data
US 2011/0127511 A1 Jun. 2, 2011

(30) Foreign Application Priority Data
Dec. 2, 2009 (KR) ........................ 10-2009-0118460

(51) Int. Cl.
*H01L 29/08* (2006.01)
*H01L 35/24* (2006.01)
*H01L 51/00* (2006.01)
(52) U.S. Cl. ................... 257/40; 257/E51.018
(58) Field of Classification Search .............. 257/40, 257/E51.018; 313/504
See application file for complete search history.

(56) References Cited

U.S. PATENT DOCUMENTS

| | | |
|---|---|---|
| 2005/0012455 A1 | 1/2005 | Lee et al. |
| 2005/0175858 A1 | 8/2005 | Jung et al. |
| 2007/0075627 A1* | 4/2007 | Kimura et al. ............... 313/503 |
| 2008/0136318 A1* | 6/2008 | Kashiwabara ............... 313/504 |
| 2008/0143649 A1 | 6/2008 | Asaki et al. |
| 2010/0237335 A1* | 9/2010 | Takaya ........................... 257/40 |

FOREIGN PATENT DOCUMENTS

| | | |
|---|---|---|
| KR | 10-2003-0075387 | 9/2003 |
| KR | 10-2005-0010332 | 1/2005 |
| KR | 10-2006-0023634 | 3/2006 |
| KR | 10-2007-0079946 | 8/2007 |
| KR | 10-2008-0012177 | 2/2008 |

OTHER PUBLICATIONS

KIPO Office action dated Apr. 18, 2011 in priority Korean application No. 10-2009-0118460, 3 pps.

* cited by examiner

*Primary Examiner* — William D Coleman
*Assistant Examiner* — Christine Enad
(74) *Attorney, Agent, or Firm* — Christie, Parker & Hale, LLP

(57) ABSTRACT

A top-emitting organic light-emitting device (OLED) including a reflective first electrode layer; a semitransparent second electrode layer facing the first electrode layer; and an organic layer between the first electrode layer and the second electrode layer, wherein the organic layer comprises a first layer, a second layer, and an emission layer between the first layer and the second layer, wherein the sum of the thicknesses of the emission layer and the second layer is about 0.15 to about 0.30 times the thickness of the entire organic layer. The top-emitting OLED may have high efficiency, and thus driving voltage may be reduced.

8 Claims, 5 Drawing Sheets

TOP-EMITTING ORGANIC LIGHT-EMITTING DEVICE

CROSS-REFERENCE TO RELATED APPLICATION

This application claims priority to and the benefit of Korean Patent Application No. 10-2009-0118460, filed on Dec. 2, 2009, in the Korean Intellectual Property Office, the entire content of which is incorporated herein by reference.

BACKGROUND

1. Field

One or more embodiments of the present invention relates to a top-emitting organic light-emitting device (OLED).

2. Description of the Related Art

Organic light-emitting devices are self-emission type display devices that may have a wide viewing angle, a high contrast ratio, and a short response time. Due to these characteristics, organic light-emitting devices are drawing more attention. In addition, organic light-emitting devices may have a lower driving voltage and shorter response time than inorganic light-emitting devices and may render multi-colored displays. Thus, much research into such organic light-emitting devices has been conducted.

Typically, an OLED has an anode/emission layer (EML)/cathode structure. Various other suitable structures of OLEDs, such as an anode/hole transport layer (HTL)/EML/cathode structure and an anode/HTL/EML/electron injection layer (EIL)/cathode structure, may obtained by interposing layers such as a hole injection layer (HIL), HTL, and EIL at various suitable positions between the anode and the EML or between the EML and the cathode. For example, the structure of a general organic light emitting device is disclosed in KR 2005-0040960, the entire content of which is incorporated herein by reference.

SUMMARY

One or more aspects of embodiments of the present invention are directed toward an organic light-emitting device (OLED) having high emission efficiency.

Additional aspects will be set forth in part in the description which follows and, in part, will be apparent from the description, or may be learned by practice of the presented embodiments.

According to one or more embodiments of the present invention, a top-emitting organic light-emitting device (OLED) includes: a reflective first electrode layer; a semi-transparent second electrode layer facing the first electrode layer; and an organic layer between the first electrode layer and the second electrode layer, wherein the organic layer includes a first layer, a second layer, and an emission layer between the first layer and the second layer, wherein the sum of the thicknesses of the emission layer and the second layer is in the range of about 0.15 to about 0.30 times the thickness of the entire organic layer.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
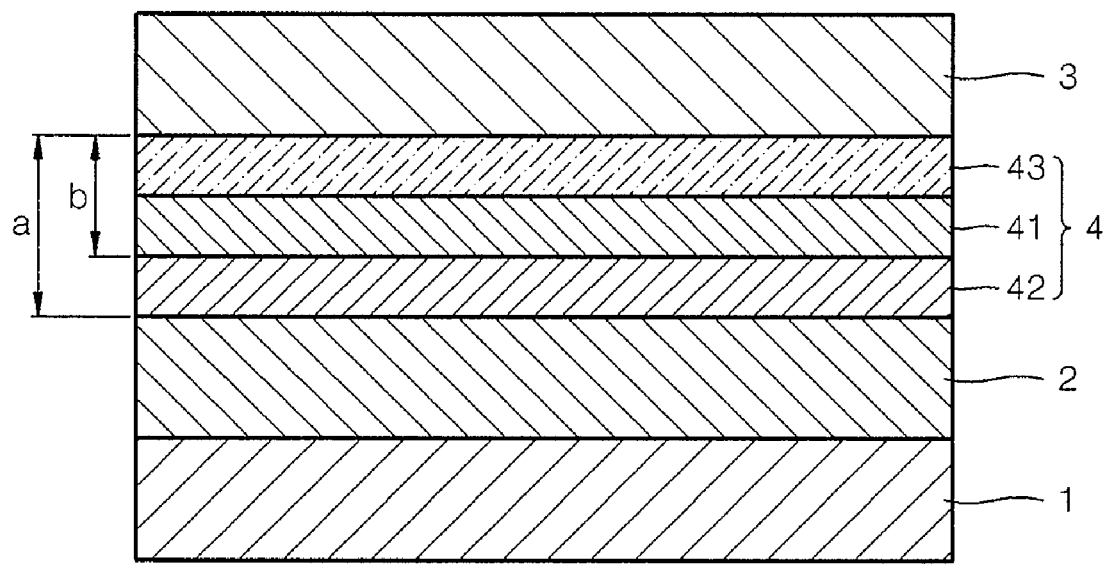
FIG. 1 is a schematic cross-sectional view of an organic light-emitting device (OLED) according to an embodiment of the present invention.

Reference will now be made in detail to embodiments, examples of which are illustrated in the accompanying drawings, wherein like reference numerals refer to like elements throughout. Also, in the context of the present application, when a first element is referred to as being "on" a second element, it can be directly on the second element or be indirectly on the second element with one or more intervening elements interposed therebetween. In this regard, the present embodiments may have different forms and should not be construed as being limited to the descriptions set forth herein. Accordingly, the embodiments are merely described below, by referring to the figures, to explain aspects of the present invention.

A top-emitting organic light-emitting device (OLED) according to an embodiment of the present invention includes: a reflective first electrode layer; a semitransparent second electrode layer facing (or that is opposite to) the first electrode layer; and an organic layer between the first electrode layer and the second electrode layer, wherein the organic layer includes a first layer, a second layer, and an emission layer between the first layer and the second layer, wherein the sum of the thicknesses of the emission layer and the second layer is in the range of about 0.15 to about 0.30 times of the thickness of the entire organic layer. The sum of the thicknesses of the emission layer and the second layer may be in the range of about 0.20 to about 0.28 times of the thickness of the entire organic layer.

Here, the OLED has high efficiency when the ratio of the sum of thicknesses of the emission layer and the second layer to the thickness of the entire organic layer is within the range described above.

The first layer may have a structure in which a hole injection layer (HIL), a hole transport layer (HTL), and/or an electron blocking layer (EBL) are sequentially stacked. The second layer may have a structure in which a hole blocking layer (HBL), an electron transport layer (ETL), and/or an electron injection layer (EIL) are sequentially stacked.

The OLED according to an embodiment of the present invention is a top-emitting OLED.

In a top-emitting OLED according to an embodiment, a reflective metal is used in the first electrode layer. For example, the reflectivity of the first electrode layer is greater than or equal to 80%.

For example, the first electrode layer may be formed by depositing a transparent conductive material such as indium tin oxide (ITO) and/or indium zinc oxide (IZO) on a metal. The metal in the first electrode layer may be chromium (Cr), gold (Au), platinum (Pt), nickel (Ni), copper (Cu), tungsten (W), silver (Ag), aluminum (Al), or alloys (or combinations) thereof.

In addition, in some embodiments, the organic layer forms a microcavity structure to generate resonance effects. For this, the second electrode layer has a dichroic mirror so as to form a resonance structure. The second electrode layer formed of (or having) the dichroic mirror may function as an optical resonator with the first electrode layer that is formed of a reflective metal. The dichroic mirror includes aluminum (Al), magnesium (Mg), calcium (Ca), sodium (Na), silver (Ag), chromium (Cr), or alloys (or combinations) thereof to have optical reflection characteristics. Any suitable material may be used to form the resonance structure without limitation.

Reference will now be made in more detail to the exemplary embodiments, examples of which are illustrated in the accompanying drawings.

FIG. 1 is a schematic cross-sectional view of an organic light-emitting device (OLED) according to an embodiment of the present invention.

In the OLED shown in FIG. 1, a first electrode layer 2 is formed on a substrate 1 that is formed of a transparent material, an organic layer 4 including at least one emission layer 41 is formed on the first electrode layer 2, and a second electrode layer 3 having a polarity different from that of the first electrode layer 2 is formed on the organic layer 4. In addition, a sealing member that seals the first electrode layer 2, the organic layer 4, and the second electrode layer 3 may further be formed on the second electrode layer 3. Hereinafter, a schematic structure of the OLED will be described without describing the sealing member for descriptive convenience.

A transparent glass substrate containing $SiO_2$ as a component (e.g., a main component) may be used as the transparent substrate 1. A buffer layer may further be formed on the transparent substrate 1 to improve smoothness of the substrate 1 and inhibits permeation of impurities. The buffer layer may be formed of $SiO_2$.

The first electrode layer 2 that is formed on the transparent substrate 1 may be formed of a reflective material by depositing indium tin oxide (ITO) and metal on the substrate 1 using photolithography to form a pattern. In a passive matrix (PM) type OLED (or PMOLED), the first electrode layer 2 may have stripe-shaped lines spaced apart from each other by an interval. In an active matrix (AM) type OLED (or AMOLED), the first electrode layer 2 may have a shape corresponding to pixels. The AM type OLED may further include a thin film transistor (TFT) layer including one or more thin film transistors between the first electrode layer 2 and the transparent substrate 1, the first electrode layer 2 being electrically connected to the TFT layer. Embodiments that will be described later may also include a TFT layer.

The first electrode layer 2 that is formed of ITO/metal may be connected to an external first electrode terminal to function as an anode electrode.

The second electrode layer 3 may be formed on the first electrode layer 2 using a semitransparent material such as magnesium (Mg)/silver (Ag) that is able to form a resonant structure (e.g., an optical resonator). The second electrode layer 3 is connected to an external second electrode terminal to function as a cathode electrode.

In a PM type OLED, the second electrode layer 3 may have stripe-shaped lines that are perpendicular to those of the first electrode layer. In an AM type OLED, the second electrode layer 3 may have a shape corresponding to pixels. In the AM type OLED, the second electrode layer 3 may be formed on (or over) the entire active region in which images are formed (or displayed).

The polarity of the first electrode layer 2 may be opposite to (or different from) that of the second electrode layer 3.

The organic layer 4 that is interposed between the first electrode layer 2 and the second electrode layer 3 includes the emission layer 41 that emits light by electrical operations of (e.g., voltages applied to) the first electrode layer 2 and the second electrode layer 3.

The organic layer may include a low molecular weight organic material or a high molecular weight material.

An organic layer 4 that is formed of a low molecular weight organic material may include a first layer 42 including a HTL and a HIL in the direction from the EML 41 to the first electrode layer 2 (e.g., the HTL may be located between the EML and the HIL) and a second layer 43 including an ETL and an EIL in the direction from the EML 41 to the second electrode layer 3 (e.g., the ETL may be located between the EML and the EIL). The HIL, HTL, ETL, and EIL may also be arranged in various suitable ways.

In addition, the organic material may be copper phthalocyanine (CuPc), N,N'-di(naphthalene-1-yl)-N,N'-diphenyl-benzidine (NPB), tris-8-hydroxyquinoline aluminum (Alq3), or the like. In a full-color OLED, the organic layer 4 may have various suitable patterns such that the EML 41 corresponds to colors of each pixel. Such a low molecular weight organic layer may be formed by heating and depositing an organic material in a vacuum. The EML 41 may be formed by sequentially depositing organic materials for each color by using masks with slits having a pattern in order to correspond to each pixel.

An organic layer 4 that is formed of a high molecular weight organic material includes a first layer 42 including a HTL in the direction from the EML 41 to the first electrode layer 2 (or between the EML 41 and the first electrode layer 2). The second electrode layer 43 may not be formed. The high molecular weight HTL may be formed on the first electrode layer 2 that is formed on the transparent substrate 1 using poly-(2,4)-ethylene-dihydroxythiophene (PEDOT), polyaniline (PANI), or the like using inkjet printing or spin coating. The high molecular weight organic EML 41 may be formed of poly(p-phenylene vinylene) (PPV), soluble PPV, cyano-PPV, polyfluorene, or the like using inkjet printing, spin coating, or thermal transferring using laser beams.

The sealing member that is formed on the second electrode layer 3 may be a metal cap including an absorbent (e.g., for absorbing moisture). Alternatively, a sealing resin may be coated on the second electrode layer 3 to block permeation of moisture. The sealing member may also be formed using a substrate.

According to some embodiments, the ratio of the sum (b) of the thicknesses of the EML 41 and the second layer 43 to the thickness of (a) of the organic layer 4, i.e., the e-ratio b/a, may be in the range of about 0.15 to about 0.30, for example, about 0.20 to about 0.28.

When the thickness ratio is within the range described above, resonance may occur to increase efficiency of the OLED. Thus, driving voltage of the OLED may be reduced.

Hereinafter, one or more embodiments will be described in detail with reference to the following examples. However, these examples are not intended to limit the purpose and scope of the invention.

Example 1

A corning 15 $\Omega/cm^2$ (1200 Å) Ag/ITO (Ag:ITO=100 nm:5 nm) glass substrate was cut into a size of 50 mm×50 mm×0.7 mm and sonicated with isopropyl alcohol and pure water each for 5 minutes to prepare an anode. The Ag/ITO glass substrate was irradiated with UV light for 30 minutes, exposed to ozone, and installed in a vacuum deposition device.

A material, LHT-001 (manufactured by LUDIS) that is used to form a HTL and also has hole injecting functions was vacuum deposited on the substrate to form a HTL with a thickness of 140 nm.

A known blue fluorescent host (manufactured by Tetrahedron Ltd.) and GBD34 as a known blue fluorescent dopant (manufactured by Gracel Co., Ltd.) having the amount in the range of (or constituting between) 3 to 5 wt % were simultaneously or concurrently deposited on the HTL to form a blue fluorescent EML having a thickness of 20 nm.

Then, Alq3 was vacuum deposited on the EML to form an ETL having a thickness of 30 nm. Then, lithium fluoride (LiF) was vacuum deposited on the ETL to form an EIL having a thickness of 0.5 nm, and Mg/Ag (Mg:Ag=10:1) was vacuum deposited thereon to a thickness of 12 nm as a cathode to prepare an OLED. The OLED had a ratio of the sum of the thicknesses of the EML and the ETL to the thickness of the entire organic layer (or e-ratio) of 0.26 to 1.

Example 2

An OLED was prepared in the same manner as in Example 1, except that the thickness of the HTL was 170 nm and a green EML having a thickness of 35 nm was formed using GGH01 as a fluorescent host and GGD01 as a fluorescent dopant, which are manufactured by Gracel Co., Ltd.

The OLED had a ratio of the sum of the thicknesses of the EML and the ETL to the thickness of the entire organic layer (or e-ratio) of 0.28 to 1.

Example 3

An OLED was prepared in the same manner as in Example 1, except that the thickness of the HTL was 210 nm and a red EML having a thickness of 40 nm was formed using GDI 1403 as a phosphorescent host and UDC as a phosphorescent dopant which are manufactured by Gracel Co., Ltd.

The OLED had a ratio of the sum of the thicknesses of the EML and the ETL to the thickness of the entire organic layer (or e-ratio) of 0.25 to 1.

Comparative Example 1

An OLED was prepared in the same manner as in Example 1, except that the sum of the thicknesses of the EML, the ETL, and the EIL to the thickness of the entire organic layer was 0.39 to 1, wherein the thickness of the HTL was 140 nm, the thickness of the EML was 20 nm, the thickness of the ETL was 70 nm, and the thickness of the EIL was 0.5 nm.

The OLED had a ratio of the sum of the thicknesses of the EML and the ETL to the thickness of the entire organic layer (or e-ratio) of 0.39 to 1.

The thicknesses of the EIL, ETL, EML, and HTL, the sum of the thicknesses of the EML and the second layer, the thickness of the entire organic layer, and the ratio of the sum of the thicknesses of the EML and the ETL to the thickness of the entire organic layer are listed in Table 1 below.

TABLE 1

|  | Example 1 | Example 2 | Example 3 | Comparative Example 1 |
| --- | --- | --- | --- | --- |
| EIL | 0.5 nm | 0.5 nm | 0.5 nm | 0.5 nm |
| ETL | 30 nm | 30 nm | 30 nm | 70 nm |
| EML | 20 nm | 35 nm | 40 nm | 20 nm |
| HTL | 140 nm | 170 nm | 210 nm | 140 nm |

TABLE 1-continued

|  | Example 1 | Example 2 | Example 3 | Comparative Example 1 |
| --- | --- | --- | --- | --- |
| EML + second layer (b) | 50.5 nm | 65.5 nm | 70.5 nm | 90.5 nm |
| Organic layer (a) | 190.5 nm | 235.05 | 280.5 nm | 230.5 nm |
| e-ratio (b/a) | 0.26 | 0.28 | 0.25 | 0.39 |

Figure 2:
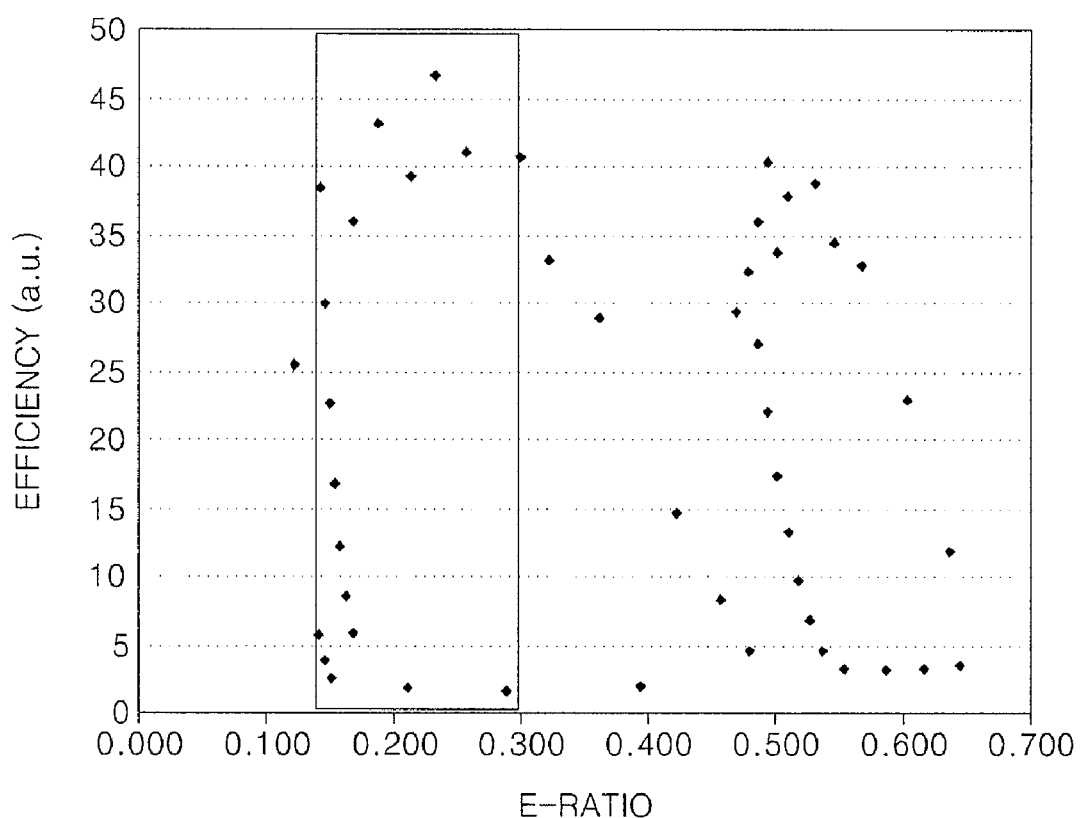
FIG. 2 is a graph illustrating efficiency of an OLED according to another embodiment of the present invention.
Figure 3:
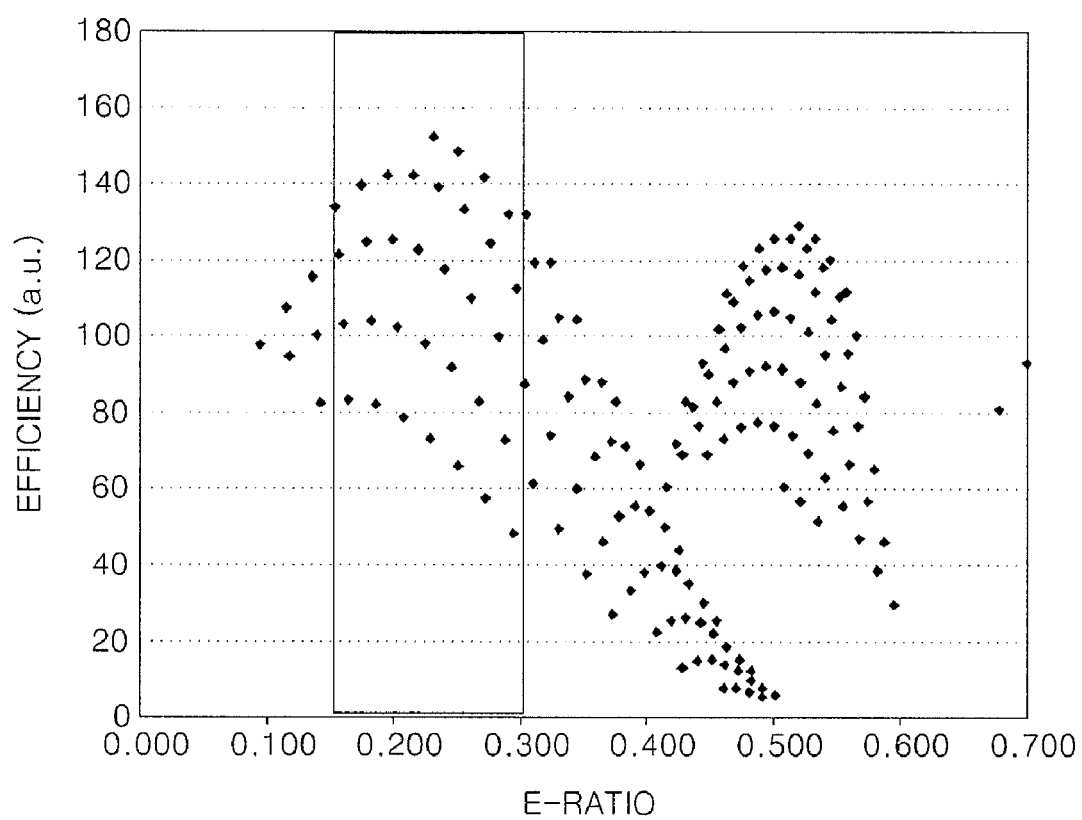
FIG. 3 is a graph illustrating efficiency of an OLED according to another embodiment of the present invention.
Figure 4:
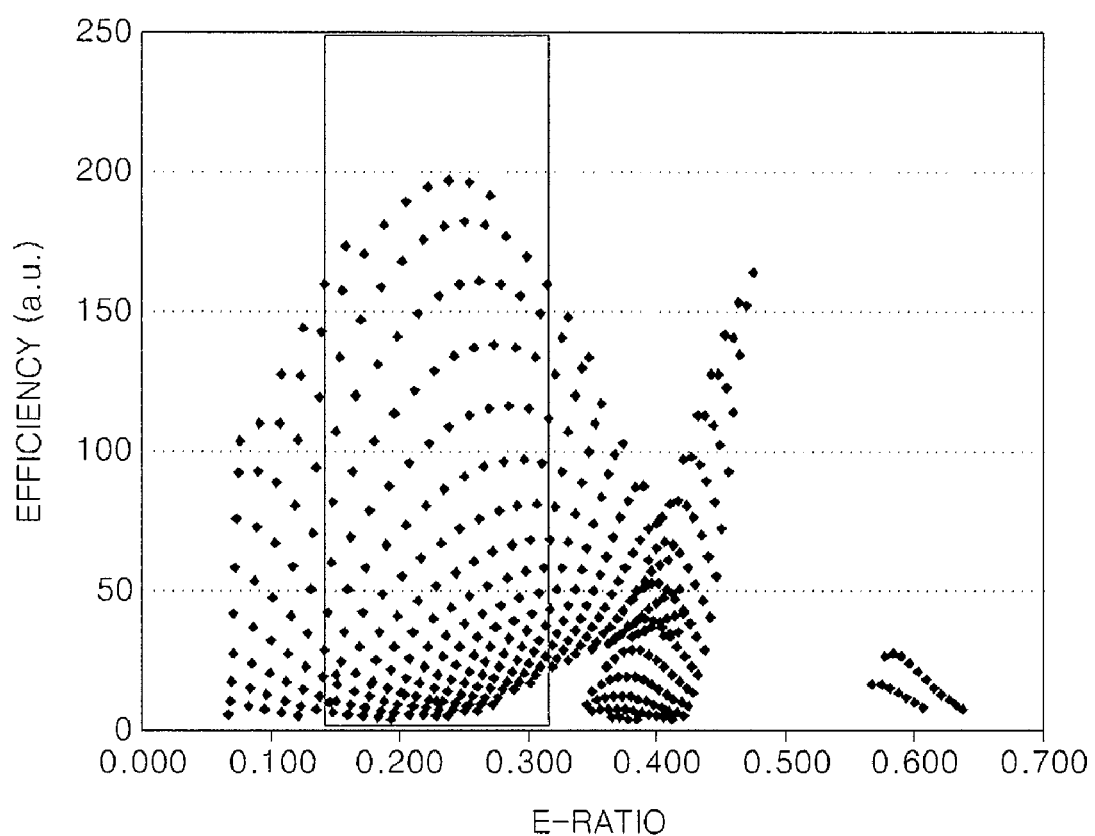
FIG. 4 is a graph illustrating efficiency of an OLED according to another embodiment of the present invention.

Efficiencies of the OLEDs prepared according to Examples 1 to 3 were measured with respect to the ratio of the sum of the thicknesses of the EML, ETL, and EIL to the thickness of the entire organic layer (e-ratio), and the results are shown in FIGS. 2 to 4.

FIGS. 2 to 4 respectively show relative current efficiencies (Cd/A) with respect to the e-ratio of blue, green, and red OLEDs. Thus, efficiency with respect to the e-ratio of each device corresponds to each point shown in the graphs of FIGS. 2 to 4. Simulations to evaluate relative efficiency were performed while the thicknesses of the HTL and the ETL were respectively changed from 0 nm to 200 nm. The thicknesses of the organic layers other than the HTL and the ETL were fixed. Since the efficiency is influenced by color coordinates, color coordinates for red, green, and blue were limited as follows within a range in which color gamut was maintained: Red: x color coordinate of 0.67 or less, Green: x color coordinate of 0.23 or less, and Blue: y color coordinate in the range of 0.04 to 0.06. In another embodiment, the color coordinates for red, green, and blue are in the ranges as follows: Red: x color coordinate of 0.69 or less, Green: x color coordinate of 0.32 or less, and Blue: y color coordinate in the range of 0.04 to 0.08. Referring to FIGS. 2 to 4, the efficiencies of each device increase and decrease showing patterns according to the e-ratio. However, e-ratios which provided the highest efficiency of red, green, and blue in consideration of real color gamut were slightly different.

FIG. 2 is a graph illustrating simulation results with respect to efficiency of a blue device according to the e-ratio within a range in which color gamut was maintained. The peak of the efficiency of the blue device was observed when the e-ratio was in the range of about 0.2 to about 0.3, and 80% or higher efficiency based on the peak efficiency were observed when the e-ratio was in the range of about 0.14 to about 0.3.

FIG. 3 is a graph illustrating simulation results with respect to efficiency of a green device according to the e-ratio within a range in which color gamut was maintained. 80% or higher efficiency based on the peak efficiency was observed when the e-ratio was in the range of about 0.15 to about 0.3.

FIG. 4 is a graph illustrating simulation results with respect to efficiency of a red device according to the e-ratio within a range in which color gamut was maintained. 80% or higher efficiency based on the peak efficiency was observed when the e-ratio was in the range of about 0.14 to about 0.31.

Figure 5:
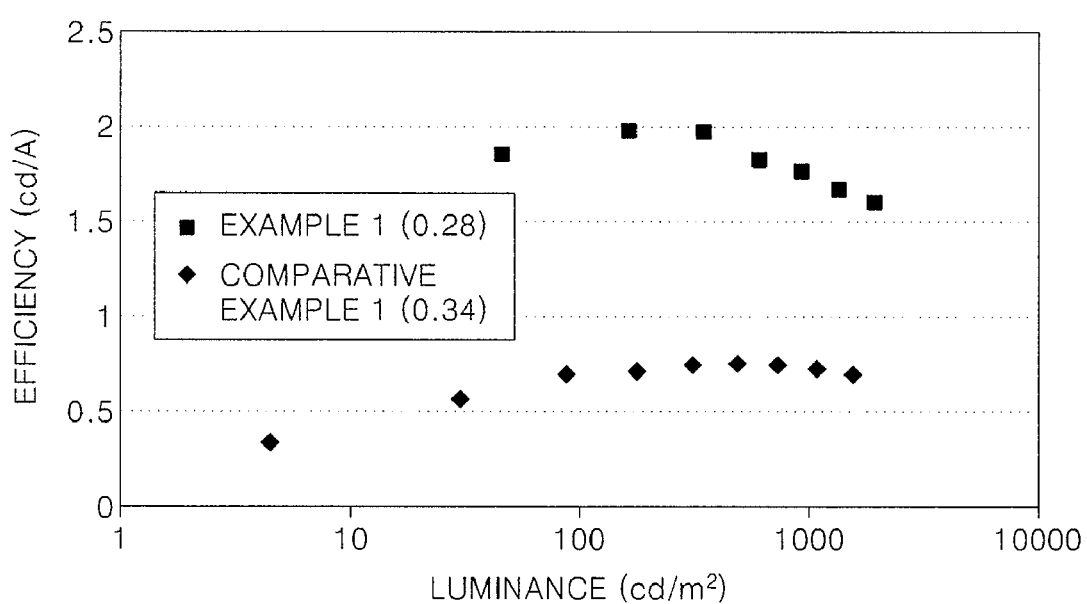
FIG. 5 is a graph illustrating efficiency of an OLED according to another embodiment of the present invention with respect to brightness.

FIG. 5 is a graph illustrating efficiencies with respect to brightness of the OLEDs prepared according to Example 1, in which the ratio of the sum of the thicknesses of the EML, the ETL, and the EIL to the thickness of the entire organic layer was 0.28:1, and Comparative Example 1.

Initial characteristics of the OLEDs are shown in Table 2 below.

TABLE 2

| | e-ratio | Driving voltage (V) | Current density (mA/cm²) | Brightness (Cd) | Emission efficiency Cd/A | Quantum efficiency (%) | Color coordinate |
|---|---|---|---|---|---|---|---|
| Example 1 | 0.26 | 4.2 | 22.9 | 433 | 1.9 | 3.5 | (0.136, 0.057) |
| Comparative example 1 | 0.39 | 5.3 | 54.6 | 411 | 0.8 | 1.4 | (0.140, 0.053) |

As can be seen in Table 2, above, an OLED prepared according to an embodiment according to Example 1 may have high efficiency, and thus driving voltage may be reduced.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A top-emitting organic light-emitting device (OLED) comprising:
   a reflective first electrode layer;
   a semitransparent second electrode layer facing the first electrode layer; and
   an organic layer between the first electrode layer and the second electrode layer,
   wherein the organic layer comprises a first layer, a second layer, and an emission layer between the first layer and the second layer,
   wherein a sum of thicknesses of the emission layer and the second layer is in the range of about 0.15 to about 0.30 times a thickness of the entire organic layer, and
   wherein the second layer comprises an electron transport layer and an electron injection layer.

2. The top-emitting OLED of claim 1, wherein the sum of the thicknesses of the emission layer and the second layer is in the range of about 0.20 to about 0.28 times the thickness of the entire organic layer.

3. The top-emitting OLED of claim 1, wherein the first electrode layer has a reflectivity greater than or equal to 80%.

4. The top-emitting OLED of claim 1, wherein the first electrode layer comprises chromium (Cr), gold (Au), platinum (Pt), nickel (Ni), copper (Cu), tungsten (W), silver (Ag), aluminum (Al), or an alloy thereof.

5. The top-emitting OLED of claim 1, wherein the second electrode layer comprises aluminum (Al), magnesium (Mg), calcium (Ca), sodium (Na), silver (Ag), chromium (Cr), or an alloy thereof.

6. The top-emitting OLED of claim 1, wherein the emission layer is configured to emit red light having an x color coordinate less than or equal to 0.69.

7. The top-emitting OLED of claim 1, wherein the emission layer is configured to emit green light having an x color coordinate less than or equal to 0.32.

8. The top-emitting OLED of claim 1, wherein the emission layer is configured to emit blue light having a y color coordinate in the range of 0.04 to 0.08.

* * * * *